United States Patent
Pomaranski et al.

(10) Patent No.: US 7,328,380 B2
(45) Date of Patent: Feb. 5, 2008

(54) MEMORY SCRUBBING LOGIC

(75) Inventors: Ken Gary Pomaranski, Roseville, CA (US); Andy Harvey Barr, Roseville, CA (US); Dale John Shidla, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 380 days.

(21) Appl. No.: 10/659,901

(22) Filed: Sep. 11, 2003

(65) Prior Publication Data

US 2005/0060603 A1 Mar. 17, 2005

(51) Int. Cl.
*G11C 29/00* (2006.01)
*G11C 11/406* (2006.01)

(52) U.S. Cl. .................. 714/718; 365/185.09
(58) Field of Classification Search .......... 714/48, 714/54, 718–720, 723; 710/6; 711/100, 711/106; 365/200–201
See application file for complete search history.

(56) References Cited

U.S. PATENT DOCUMENTS

| | | | |
|---|---|---|---|
| 6,223,301 B1 * | 4/2001 | Santeler et al. | 714/6 |
| 6,292,869 B1 * | 9/2001 | Gerchman et al. | 711/106 |
| 6,480,982 B1 * | 11/2002 | Chan et al. | 714/764 |
| 6,754,758 B2 * | 6/2004 | Addy | 710/301 |
| 6,766,429 B1 * | 7/2004 | Bland et al. | 711/161 |
| 6,832,340 B2 * | 12/2004 | Larson et al. | 714/42 |
| 2005/0060603 A1 * | 3/2005 | Pomaranski et al. | 714/7 |

OTHER PUBLICATIONS

IBM Chipkill Memory IBM Business Machines 1999 Enhancing IBM Netfinity Server Reliability.*

* cited by examiner

*Primary Examiner*—Cynthia Britt

(57) ABSTRACT

An example memory scrubbing logic is provided. The logic may be operably connectable to a main memory and a processor. The memory access logic may include a memory for mirroring a main memory location and a logic for scrubbing the main memory location.

58 Claims, 8 Drawing Sheets

MEMORY SCRUBBING LOGIC

BACKGROUND

Computer systems may have large main memories, and these memories continue to expand in size. The main memories may be built, for example, from dynamic random access memory (DRAM) chips. Some computer systems may have thousands of DRAM chips.

Main memory locations may experience memory faults. Managing these memory faults can facilitate improving system performance and reducing memory related system crashes. Thus, systems may attempt to detect and/or correct memory faults during system (re)boots and/or when a memory location is accessed. The location may be accessed, for example, by a user level application, a memory diagnostic program (e.g., software scrubber) and/or an operating system kernel routine. However, system (re)boots require system downtime. Furthermore software based memory fault detection and/or management schemes that rely on operating system intervention may not detect and/or manage faults in a comprehensive, timely manner.

Since (re)boots involve system downtime, this approach to detecting and/or managing memory faults may not be suitable for mission critical applications that require 24-7-365 availability. Thus, some systems have moved away from boot time detection and management and have moved towards online methods.

Online detection and/or correction methods manage memory faults on-the-fly (e.g., substantially in real-time as they are discovered). Some methods manage memory (e.g., detect/correct memory faults) as it is accessed. Thus, frequently accessed memory is regularly managed while infrequently accessed memory may be irregularly managed. The irregularly managed memory may accumulate memory errors which, if they had been timely managed, could have been handled. But, since they are not timely handled, these accumulating memory errors may produce catastrophic results like a system crash. Thus, to facilitate discovering errors, even in infrequently accessed memory, some conventional methods attempt to periodically access all main memory about which they are aware. However, the conventional methods may not access all desired locations and may not rigorously test the locations they are able to access.

Methods (e.g., software scrubbers) that attempt to access all main memory areas may achieve less than one hundred percent coverage because memory areas may be blocked from access by an operating system or may be in use by an application and thus unavailable to another application like a software scrubber. Also, software scrubbers that access memory through an operating system may encounter the same memory accessing limitations that an operating system may experience. By way of illustration, if a system is running multiple operating systems substantially in parallel, then certain memory areas may be reserved for each of the operating systems. Thus, a software scrubber accessing memory through a first operating system may not be able to access memory allocated to a second operating system. By way of further illustration, a security conscious application like a virus detection application may block access to its allocated memory. Thus, conventional detection and/or correction methods may only access a subset of main memory and may do so in an indeterministic manner yielding the potential for catastrophic results based on memory faults. Furthermore, the limited memory that is accessed may not be rigorously tested.

Methods like software scrubbers may simply read a memory location and write back the bit values that were read, anticipating that the read and/or write operation will reveal memory errors and thus initiate memory fault correction. However, since memory faults may not manifest themselves in response to a simple read/write operation, some faults may not be detected even though the conventional method accesses the memory location.

BRIEF DESCRIPTION OF THE DRAWINGS

The accompanying drawings, which are incorporated in and constitute a part of the specification, illustrate various example systems, methods, and so on that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
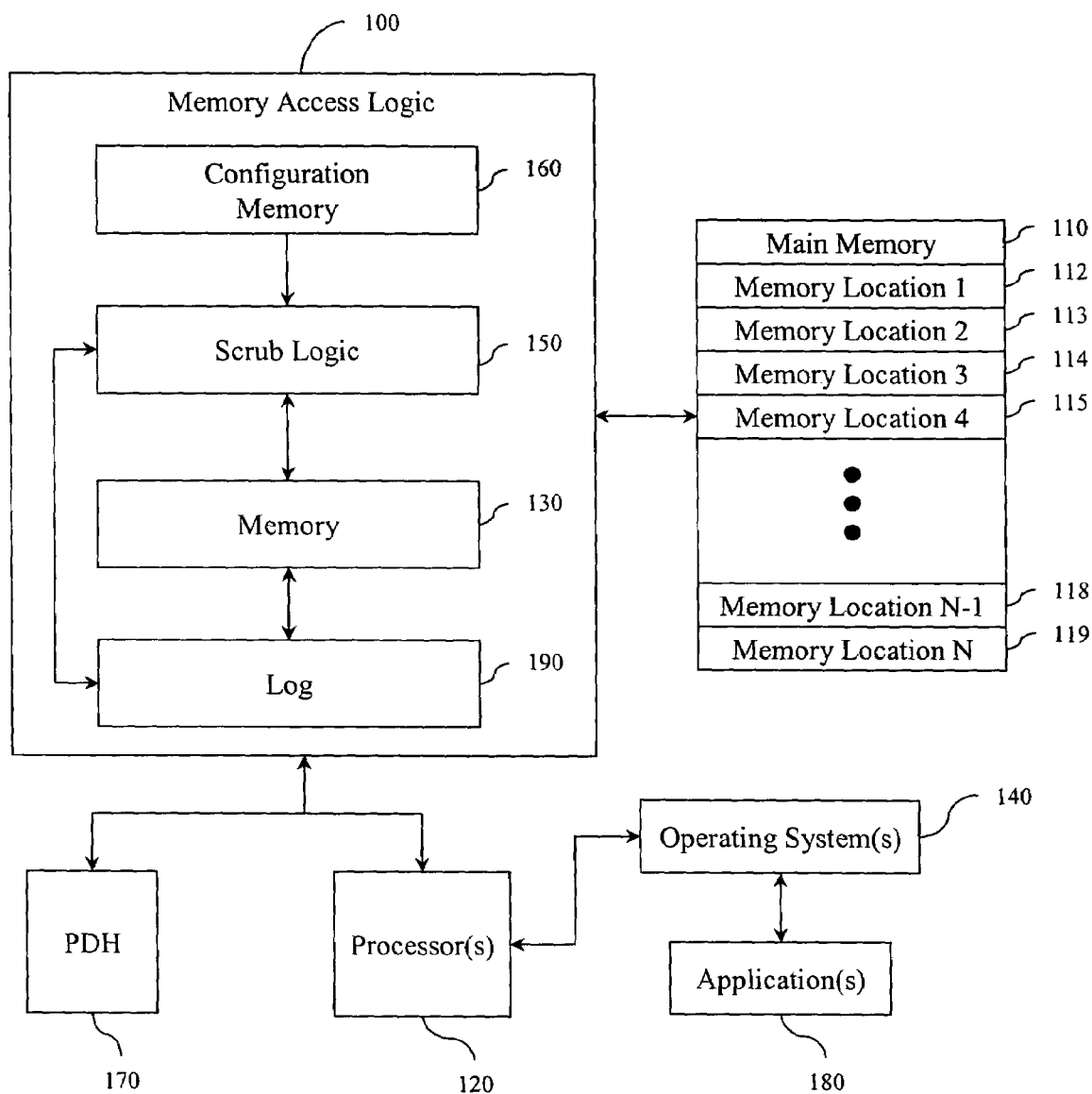
FIG. 1 illustrates an example memory access logic.

This application describes example systems, methods, computer-readable mediums and so on associated with chipset level based memory management. This hardware and/or firmware level memory managing can include, but is not limited to, memory quality assurance (e.g., scrubbing), memory fault detection, and memory fault correction and/or handling. The example systems and methods facilitate hardware and/or firmware based testing of all and/or substantially all main memory to detect memory faults. The example systems and methods may also facilitate selectively logging errors, correcting correctable errors, and/or responding to uncorrectable errors. The chipset level based memory management may occur in parallel and/or substantially in parallel with normal system operation without substantially impacting normal system operation (e.g., halting an application whose memory is being tested). In one example, the systems and methods do not engage user applications, operating systems or other similar control systems and thus do not interfere with the performance of such applications, operating systems and so on.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Chipset", as used herein, refers to one or more electronic or computer components like an application specific integrated circuit (ASIC), a programmable logic device (PLD), a programmable read only memory (PROM), a microprocessor, a controller chip, an integrated circuit, and the like. A chipset may be a single component or two or more components that are operably connected. A chipset can include hardware and/or firmware components. A chipset and/or an element of a chipset may operate independently of an operating system running on computing hardware with which the chipset is associated.

"Computer-readable medium", as used herein, refers to a medium that participates in directly or indirectly providing signals, instructions and/or data. A computer-readable medium may take forms, including, but not limited to, non-volatile media, volatile media, and transmission media. Non-volatile media may include, for example, optical or magnetic disks and so on. Volatile media may include, for example, optical or magnetic disks, dynamic memory and the like. Transmission media may include coaxial cables, copper wire, fiber optic cables, and the like. Transmission media can also take the form of electromagnetic radiation, like those generated during radio-wave and infra-red data communications, or take the form of one or more groups of signals. Common forms of a computer-readable medium include, but are not limited to, an ASIC, a compact disc (CD), a digital video disk (DVD), a random access memory (RAM), a read only memory (ROM), a PROM, an electronically erasable programmable read only memory (EEPROM), a disk, a carrier wave, a memory stick, a floppy disk, a flexible disk, a hard disk, a magnetic tape, other magnetic media, a CD-ROM, other optical media, punch cards, paper tape, other physical media with patterns of holes, an EPROM, a FLASH-EPROM, or other memory chip or card, and other media from which a computer, a processor or other electronic device can read. Signals used to propagate instructions or other software over a network, like the Internet, can be considered a "computer-readable medium."

"Logic", as used herein, includes but is not limited to hardware and firmware, optionally with embedded software, and/or combinations of each to perform a function(s) or an action(s), and/or to cause a function or action from another component. For example, based on a desired application or needs, logic may include a software controlled microprocessor, discrete logic like an ASIC, a PLD, a memory device containing instructions, or the like. A logic may be implemented as a chipset.

An "operable connection", or a connection by which entities are "operably connected", is one in which signals, physical communication flow, and/or logical communication flow may be sent and/or received. Typically, an operable connection includes a physical interface, an electrical interface, and/or a data interface, but it is to be noted that an operable connection may include differing combinations of these or other types of connections sufficient to allow operable control.

"Signal", as used herein, includes but is not limited to one or more electrical or optical signals, analog or digital, one or more computer or processor instructions, messages, a bit or bit stream, or other means that can be received, transmitted and/or detected.

"Software", as used herein, includes but is not limited to, one or more computer or processor instructions that can be read, interpreted, compiled, and/or executed and that cause a computer, processor, or other electronic device to perform functions, actions and/or behave in a desired manner. The instructions may be embodied in various forms like routines, algorithms, modules, methods, threads, and/or programs including separate applications or code from dynamically linked libraries. Software may also be implemented in a variety of executable and/or loadable forms including, but not limited to, a stand-alone program, a function call (local and/or remote), a servelet, an applet, instructions stored in a memory, part of an operating system or other types of executable instructions. It will be appreciated by one of ordinary skill in the art that the form of software may depend on, for example, requirements of a desired application, the environment in which it runs, and/or the desires of a designer/programmer or the like. It will also be appreciated that computer-readable and/or executable instructions can be located in one logic and/or distributed between two or more communicating, co-operating, and/or parallel processing logics and thus can be loaded and/or executed in serial, parallel, massively parallel and other manners.

Suitable software for implementing the various components of the example systems and methods described herein include programming languages and tools like Java, Pascal, C#, C++, C, CGI, Perl, SQL, APIs, SDKs, assembly, machine, firmware, microcode, and/or other languages and tools. Software, whether an entire system or a component of a system, may be embodied as an article of manufacture and maintained as part of a computer-readable medium as defined previously. Another form of the software may include signals that transmit program code of the software to a recipient over a network or other communication medium.

Some portions of the detailed descriptions that follow are presented in terms of algorithms and symbolic representations of operations on data bits within a memory. These algorithmic descriptions and representations are the means used by those skilled in the art to convey the substance of their work to others. An algorithm is here, and generally, conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic and the like.

It has proven convenient at times, principally for reasons of common usage, to refer to these signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, computing, calculating, determining, displaying, or the like, refer to actions and processes of a computer system, logic, processor, or similar electronic device that manipulates and transforms data represented as physical (electronic) quantities.

FIG. 1 illustrates a memory access logic 100. The logic 100 facilitates testing memory substantially in parallel with normal system operation and substantially transparently to processes that may control memory. The memory access logic 100 may be configured to be operably connected to a main memory 110 and a processor 120. The main memory 110 may include, for example, a set of memory locations (e.g., locations 112 though 119). The locations may be addressable individually and/or collectively, for example. The main memory 110 may be built from, for example, DRAM chips and/or other memory chips.

The memory access logic 100 may include a memory 130 configured to store the contents of a main memory location and to accept memory access requests for the main memory location from the processor 120 while the contents of the main memory location are stored in the memory 130. This facilitates logically isolating a main memory location so that it can be tested (e.g., scrubbed) substantially transparently to an operating system 140 and/or application 180 that may be interacting with that memory location. To the operating system 140 and/or application 180, the memory 130 will temporarily and transparently replace the mirrored main memory location. Since the memory access logic 100 can be located between the operating system 140 and main memory 100, the memory access logic 100 may not be limited by the operating system 140 and thus may access all and/or substantially all of the main memory 110.

The memory access logic 100 may also include a scrub logic 150 configured to selectively mirror a main memory location into the memory 130 and to selectively scrub the main memory location. Scrubbing includes writing the correct value back into a main memory location if the location is determined to be bad (e.g., faulty) based on the ECC in that location. The scrubbing operation may be extended to perform one or more of, a parity test, an electrical test, a striping test, a marching ones test, a marching zeroes test, and a "worst-case" pattern test. The testing may be controlled by the scrub logic 150. Additionally, and/or alternatively, the testing may be performed by a logic located on the chip (e.g., DRAM) that holds the memory location(s) to be scrubbed. Thus, the scrub logic 150 may be further configured to initiate scrubbing the main memory location by sending a signal(s) to an onboard memory testing logic.

The scrub logic 150 may also be configured to selectively generate a signal when the main memory location that is being scrubbed exhibits a memory error. For example, the scrub logic 150 may generate a signal that can be accepted and/or interpreted by another system, process and/or component to facilitate handling and/or recording the existence of the memory error. The scrub logic 150 may, for example, be hard coded with an original scrubbing program. However, in another example, the scrub logic 150 may be writeable by an application located external to the memory access logic 100. Thus, the scrub logic 150 may be selectively reprogrammable.

The memory access logic 100 may be, for example, an ASIC. In another example, the memory access logic 100 may be an electronic or computer component including, but not limited to, a PROM, an EPROM, an EEPROM, a PLD, an integrated circuit, a microprocessor, and the like. Furthermore, while the memory access logic 100 is illustrated as a single logic, in some examples the memory access logic 100 may include two or more communicating, cooperating components that are operably connected.

In one example, the memory access logic 100 may also include a second memory (e.g., a configuration memory) 160 configured to store configuration parameters. The configuration parameters may facilitate controlling, for example, how and when the scrub logic 150 tests the main memory 110. The configuration memory 160 may be, for example, one or more registers. In one example, the configuration memory 160 may be pre-configured with scrubbing parameters. In another example, the configuration memory 160 may be provided with parameter values from a processor dependant hardware (PDH) component 170. The processor dependant hardware component 170 may be, for example, a boot ROM. In yet another example, the configuration memory 160 may be writeable by the application 180.

The application 180 may be located, for example, external to the memory access logic 100.

The configuration memory 160 may store values for parameters including, but not limited to, an on/off parameter, an address of a main memory location to be scrubbed, a starting address of a range of main memory locations to be scrubbed, an ending address of the range of main memory locations to be scrubbed, a rate parameter associated with the rate at which main memory scrubbing is to occur, and a log configuration parameter. The on/off parameter may control, for example, whether scrubbing is currently enabled. The rate parameter may be associated with, for example, how many processor 120 clock ticks are to occur between scrubbing operations. This can facilitate mitigating the impact of the scrubbing operations on overall system performance. The log configuration parameter may store, for example, one or more entry point addresses for one or more logging processes. Thus, the log configuration parameter may be a data structure like an interrupt service routine vector table that facilitates selectively performing various routines based on scrub results. For example, a first scrub result may indicate a relatively minor memory error (e.g., single occurrence, single bit error) that the memory access logic 100 may ignore while a second scrub result may indicate a relatively severe memory error (e.g., multiple occurrence, multi-bit error) to which the memory access logic 100 may react. Thus, the log configuration parameter may include, for example, entry points to various routines for ignoring minor errors and logging more serious errors.

Since the memory access logic 100 may log errors, in one example, the memory access logic 100 may also include a log 190 configured to store the value(s) of result(s) generated when main memory locations are scrubbed. The results may be produced, for example, by the scrub logic 150. The log 190 may be, for example, one or more registers. The log 190 may, in one example, be readable by the application 180 located external to the memory access logic 100. The application 180 may be, for example, a diagnostics application.

The memory access logic 100 may, for example, be embedded in, operably connected to, and/or removably attached to various devices. For example, the memory access logic 100 may be embedded in systems including, but not limited to, a computer, and an image forming device (e.g., printer).

Figure 2:
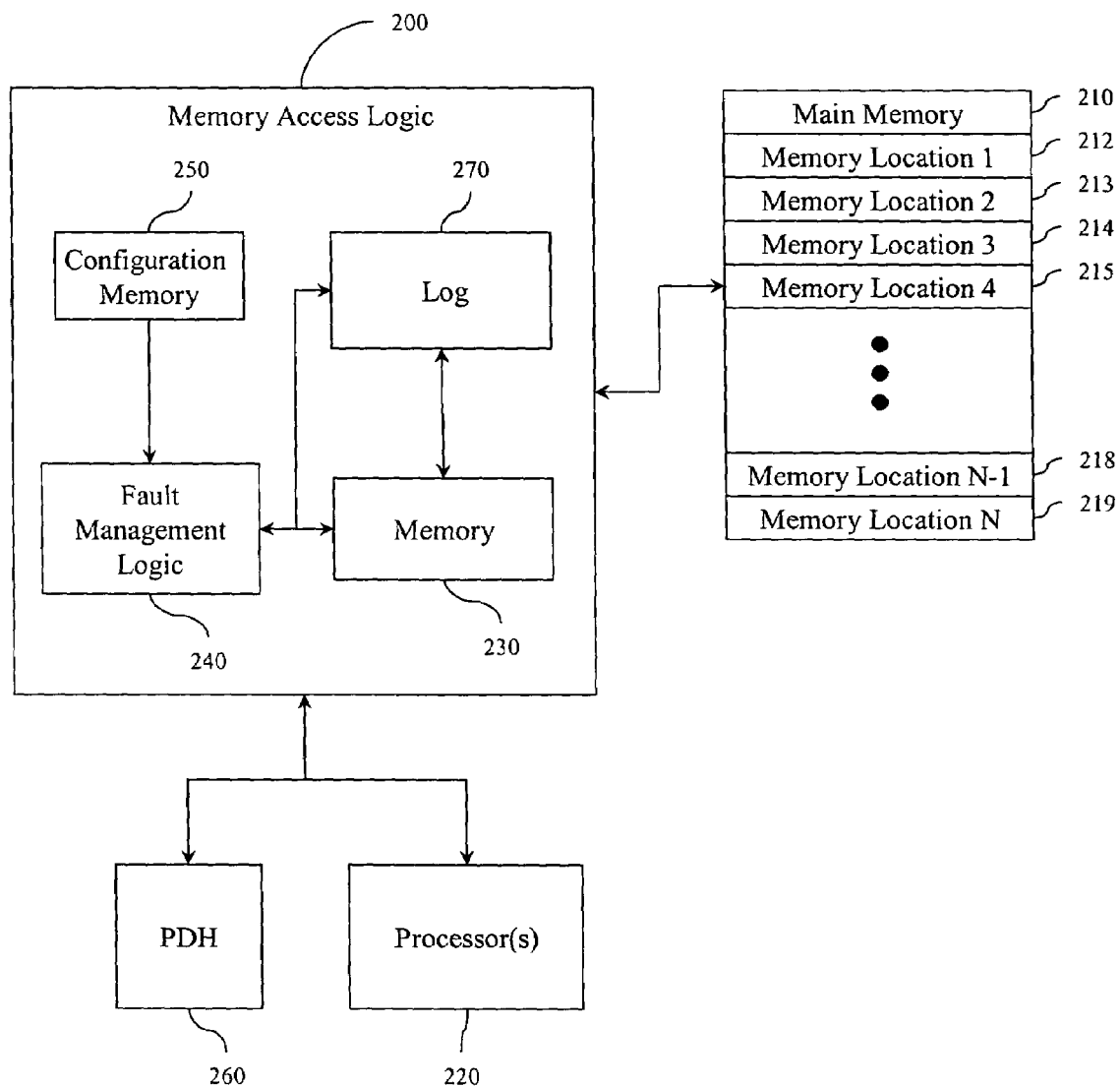
FIG. 2 illustrates another example memory access logic.

FIG. 2 illustrates a memory access logic 200 that is operably connected to a main memory 210 and a processor 220. While a single processor 220 is illustrated, it is to be appreciated that the memory access logic 200 may interact with two or more processors. Similarly, while a single main memory 210 is illustrated, it is to be appreciated that the memory access logic 200 may be connected to two or more memories.

The memory access logic 200 can be configured to programmatically or systematically perform memory fault operations for some or all of the main memory locations 210 at desired times. The operations can be performed substantially transparently to other components that may use or access a selected memory location. The memory access logic 200 may include a memory 230 configured to store the contents of the selected main memory location. For example, the contents of main memory location 212 may be copied into memory 230. Then, while the contents of main memory location 212 are stored in the memory 230, memory access requests for main memory location 212 made by the processor 220 may be directed to the memory 230 instead of the main memory location 212. Thus, the main memory location 212 is "mirrored" into (e.g., logically replaced by) the memory 230. This facilitates identifying and processing memory faults associated with main memory location 212 substantially transparently to, for example, an operating system or application that may interact with mirrored main memory location 212.

The memory access logic 200 may be configured to facilitate performing fault management processing for memory locations in the main memory 210. Thus, the memory access logic 200 may include a fault management logic 240 configured to selectively process a memory fault associated with a main memory location. Selectively processing a memory fault may include, but is not limited to, selectively logging data associated with the memory fault, selectively attempting to correct the memory fault, selectively logically removing the main memory location from the main memory 210, and selectively halting the operation of a system with which the memory access logic 200 is associated. The fault management logic 240 may also be configured to selectively generate a signal when the main memory location exhibits a memory fault. The signal may be sent, for example, to one or more processes, logics, users and so on to indicate that a memory fault has been encountered and/or handled. The fault management logic 240 may be initially programmed and/or configured to perform a first set of fault management processing. However, over time, it may be desirable to change the fault management processing. In one example, the fault management logic 240 may be physically replaced in the memory access logic 200. In another example, the fault management logic 240 may be writeable by an application external to the memory access logic 200 and thus different instructions may be loadable into the fault management logic 240.

The memory access logic 200 is illustrated as a single entity. That single entity may be, for example, an ASIC, a PROM, an EPROM, a digital signal processor (DSP), a PLD, and the like. While a single entity is illustrated, it is to be appreciated that the memory access logic 200 may include two or more such entities.

The memory access logic 200 may also include a second memory 250 that is configured to store configuration parameters associated with fault management processing. Thus, the fault management logic 240 may be further configured to selectively process memory faults based on the configuration parameters stored in the second memory 250. The second memory 250 may be, for example, a register, a set of registers, a cache memory, and so on. In one example, the memory 250 may be programmed with initial values. In another example, the memory 250 may receive values from a piece of processor dependant hardware 260 like a boot ROM. In yet another example, the memory 250 may be writeable by an application located external to the memory access logic 200, which facilitates real time control of fault management processing by the fault management logic 240.

The memory 250 may store data including, but not limited to, an on/off parameter that controls whether the fault management logic 240 is to perform fault management processing, an address of a main memory location for which fault management processing is to be performed, a starting address of a range of main memory locations for which fault management processing is to be performed, an ending address of the range of main memory locations for which fault management processing is to be performed, a rate parameter associated with the rate at which main memory fault management processing is to occur, and a log configuration parameter. In one example, the log configuration parameter may act like an interrupt vector table and thus may store entry point addresses for fault management processes.

The memory access logic 200 may also include a log 270 that is configured to store a result value produced during fault management processing for a main memory location. The result value may be produced, for example, by the fault management logic 240. The log 270 may be, for example, a register, a set of registers, a memory, and the like. In one example, the log 270 may be readable by an application residing external to the memory access logic 200. The memory access logic 200 may be included in a variety of systems including, but not limited to, a computer, and an image forming device like a printer.

Figure 3:
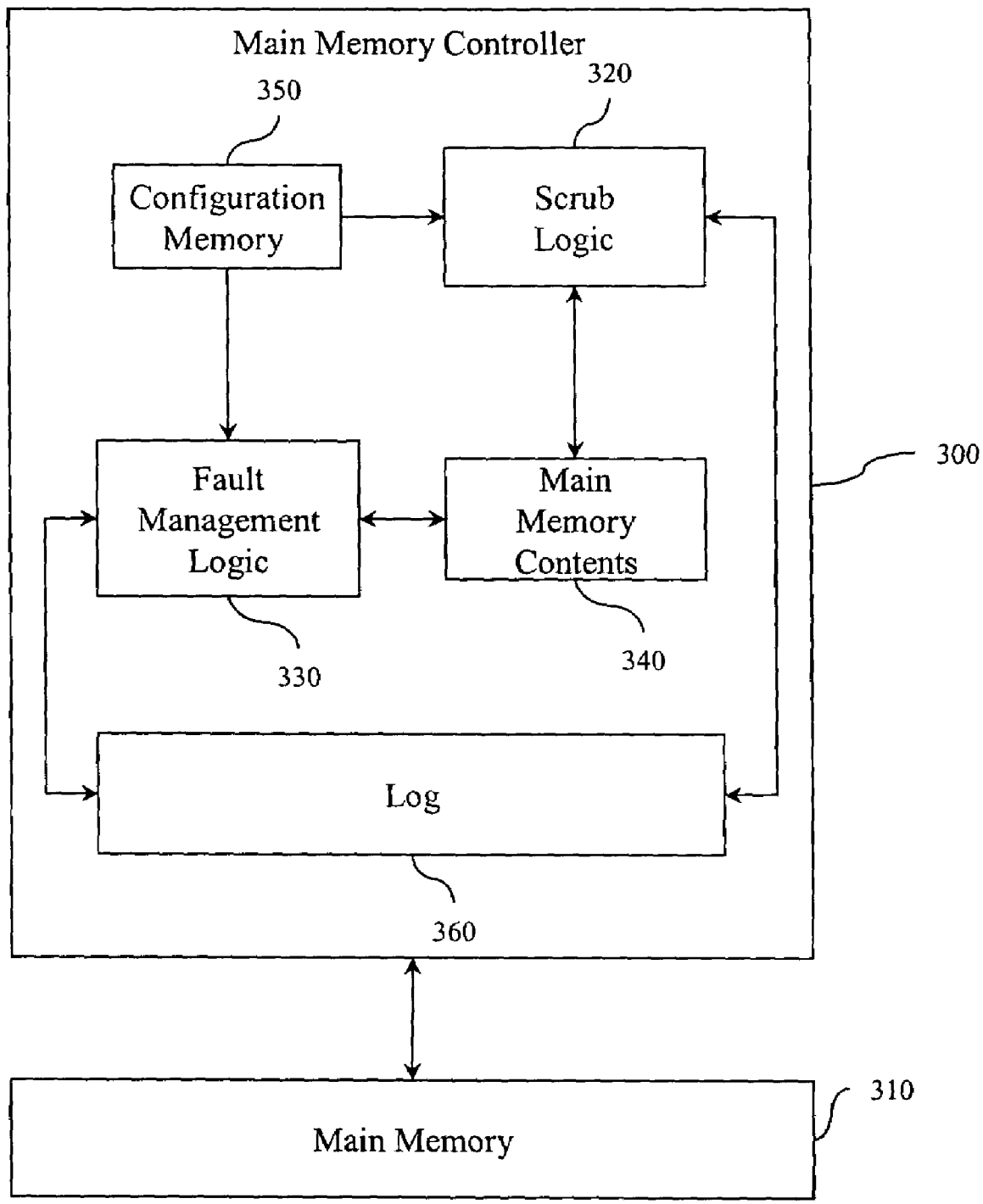
FIG. 3 illustrates an example main memory controller.

FIG. 3 illustrates a main memory controller 300 operably connected to a main memory 310. The main memory controller 300 includes both a scrub logic 320 and a fault management logic 330. The main memory controller 300 may be configured to selectively mirror a memory location from the main memory 310 into the main memory controller 300, to selectively scrub mirrored main memory locations and to selectively process memory faults discovered while scrubbing mirrored main memory locations. Thus, scrubbing and fault management processing can be performed at the chipset level without intervention from an operating system and/or application. This facilitates mitigating memory access issues associated with operating system or application level memory scrubbing.

The main memory controller 300 may include a memory 340 configured to facilitate mirroring a main memory location by, for example, storing the contents of a main memory location and accepting memory access requests for the main memory location while the contents of the main memory location are stored in the memory 340. The scrub logic 320 may be configured to selectively mirror main memory locations into the memory 340 and to selectively scrub main memory locations. Scrubbing a main memory location may include, for example, relatively simple functions like writing back the correct data, or more complex functions like performing one or more of, a parity test, an electrical test, a striping test, a marching ones test, a marching zeroes test, a "worst-case" pattern test, and the like. While the main memory location is being scrubbed, it may exhibit a memory fault. Thus, the fault management logic 330 may be configured to selectively process a memory fault experienced by the main memory location.

The main memory controller 300 may be, for example, a single component like an ASIC, a PROM, a DSP, a PLD, and so on. The main memory controller 300 may also be a chipset of such components, for example.

The main memory controller 300 may also include a second memory 350 (e.g., a configuration memory) configured to store configuration parameters like on/off parameters, an address of a main memory location to be scrubbed, a starting address of a range of main memory locations to be scrubbed, an ending address of the range of main memory locations to be scrubbed, a rate parameter associated with the rate at which main memory scrubbing is to occur, an address of a main memory location for which fault management processing is to be performed, a start address of a range of main memory locations for which fault management processing is be performed, an ending address of the range of main memory locations for which fault management processing is to be performed, and a log configuration parameter.

Thus, the scrub logic 320 may be further configured to selectively scrub main memory locations based on the configuration parameters, and the fault management logic 330 may be further configured to selectively process memory faults based on the configuration parameters.

In one example, the log configuration parameter may act like an interrupt service routine vector table and thus may store entry point addresses for fault management processes. Actions that that the fault management logic 330 and the scrubbing logic 320 may take include selectively writing (e.g., logging) information about the memory faults generated and/or processed. Thus, the main memory controller 300 may include a log 360 configured to store result values generated by scrubbing or memory fault processing. The scrub logic 320 and/or the fault management logic 330 may be further configured to produce the result value(s) and store it in the log 360. The log 360 may be, for example, a register or set of registers that may be writeable by an application external to the main memory controller (e.g., a diagnostics application).

The scrub logic 320 and/or the fault management logic 330 may be initially programmed but may additionally be configured to be writeable by an application(s). Thus, scrubbing and/or fault management instructions may be dynamically downloaded into the scrub logic 320 and/or fault management logic 330. Both the scrub logic 320 and the fault management logic 330 are configured to perform the scrubbing and/or fault management processing substantially transparently to an operating system and/or application(s) that may also be accessing the main memory 310. The main memory controller 300 may be embedded in a variety of systems including, for example, a computer and an image forming device like a printer. Embedded, in one context, means "operably connected to". Thus, the main memory controller 300 may be built into the computer or image forming device, or, in one example, the computer or image forming device may have an adapter in which the main memory controller 300 may be removably placed. Thus, the main memory controller 300 may be temporarily added to a system to facilitate chipset level scrubbing and/or fault management processing and removed later, (e.g., when the scrubbing is complete or when a pre-determined, configurable number of errors have been encountered).

Figure 4:
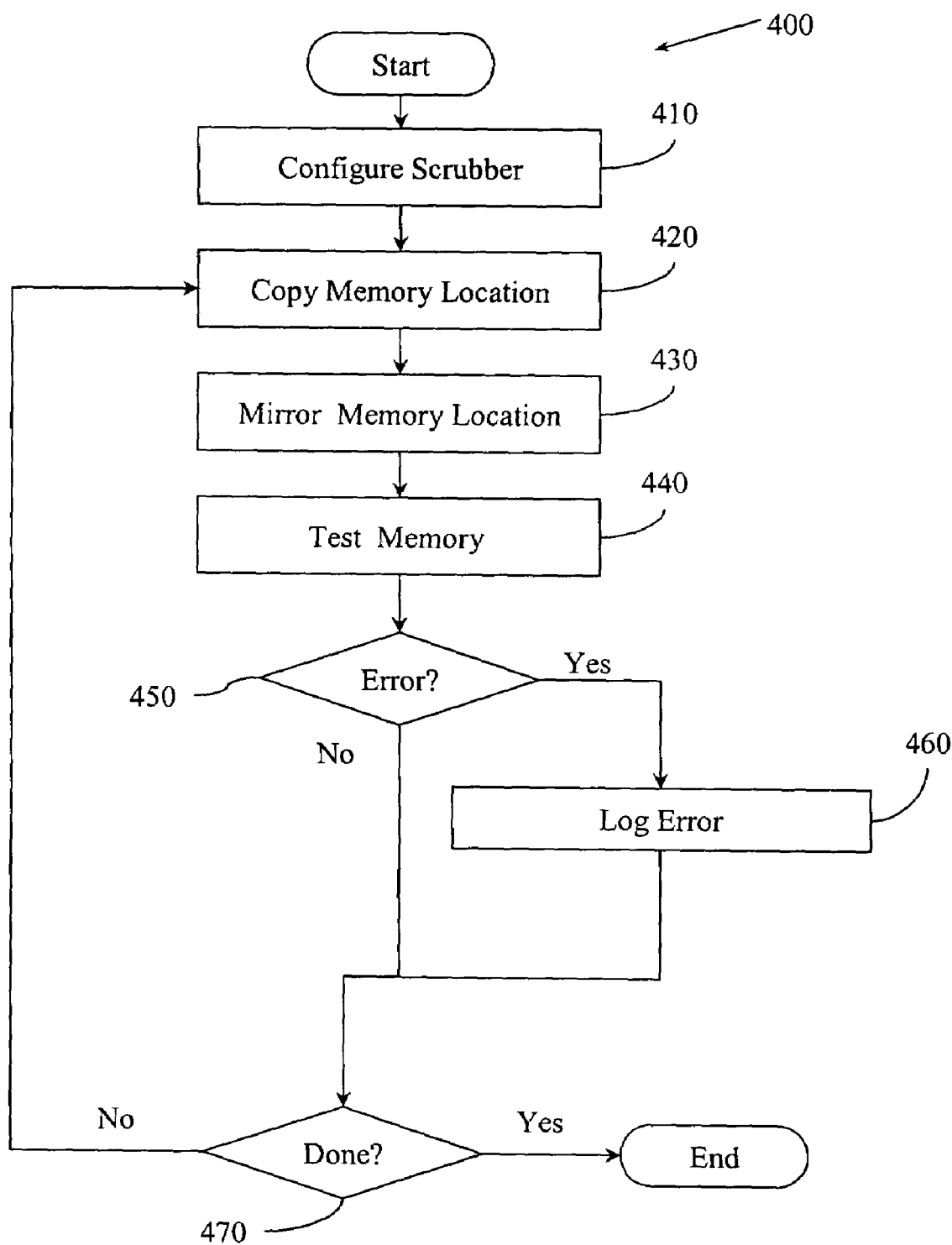
FIG. 4 illustrates an example chipset based method for scrubbing main memory.
Figure 5:
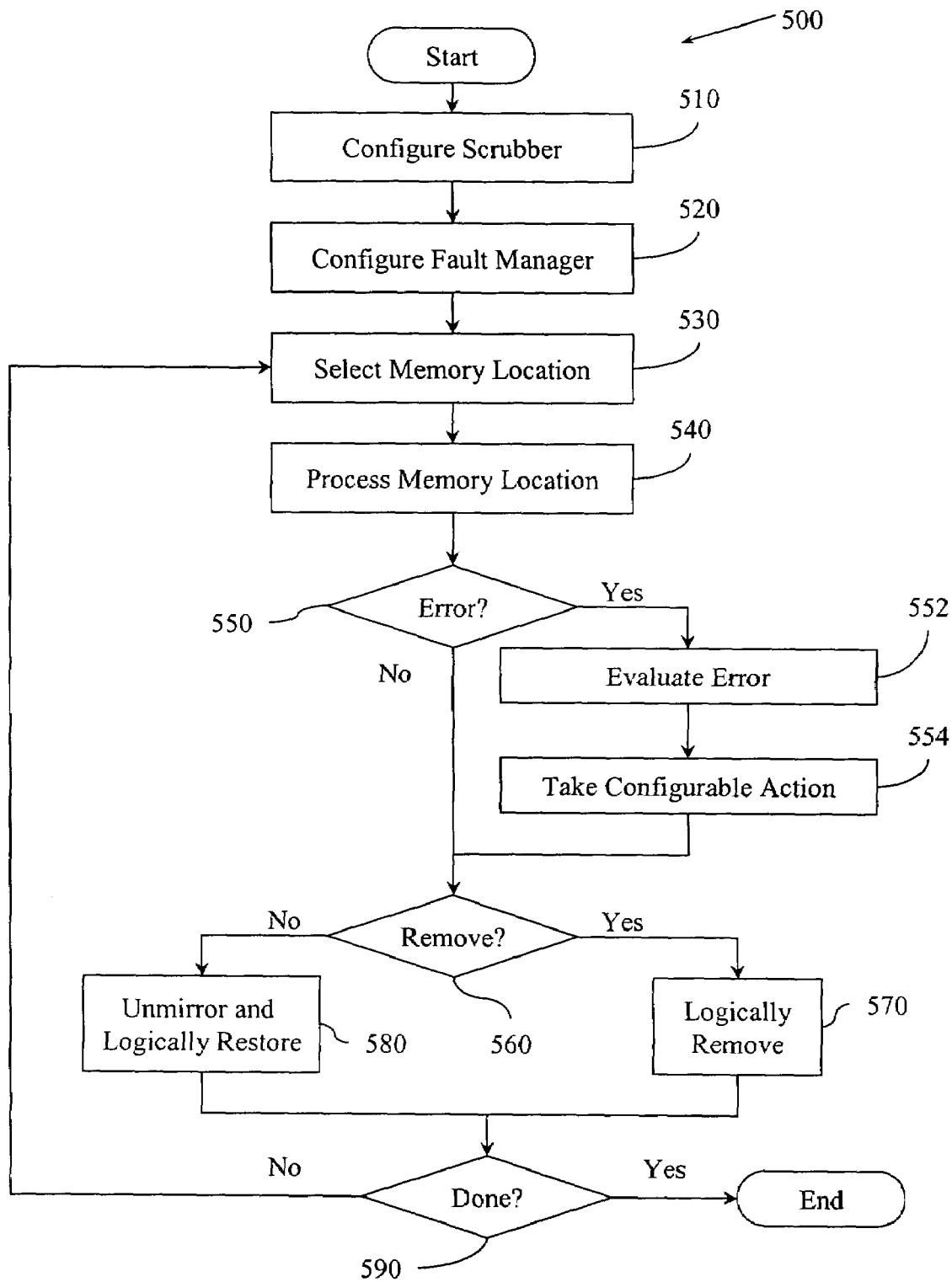
FIG. 5 illustrates an example chipset based method for scrubbing main memory and processing main memory faults encountered during scrubbing.

Example methods may be better appreciated with reference to the flow diagrams of FIGS. 4 and 5. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Furthermore, additional and/or alternative methodologies can employ additional, not illustrated blocks. In one example, methodologies are implemented as processor executable instructions and/or operations stored on a computer-readable medium. In the flow diagrams, blocks denote "processing blocks" that may be implemented, for example, in software and/or a logic.

A flow diagram does not depict syntax for any particular programming language, methodology, or style (e.g., procedural, object-oriented). Rather, a flow diagram illustrates functional information one skilled in the art may employ to fabricate logic(s) to perform the illustrated processing. It will be appreciated that in some examples program elements like temporary variables, routine loops, and so on are not shown. It will be further appreciated that electronic and software applications may involve dynamic and flexible processes so that the illustrated blocks can be performed in other sequences that are different from those shown and/or that blocks may be combined or separated into multiple components. It will be appreciated that the processes may be implemented using various programming approaches like machine language, procedural, object oriented and/or artificial intelligence techniques.

FIG. 4 illustrates an example chipset based method 400 for scrubbing main memory. The method 400 may include, at 410, configuring a scrubber (e.g., scrub logic) and/or the method 400. For example, parameters like how often memory is to be scrubbed, what memory is to be scrubbed, and how the memory is to be scrubbed may be established. By way of illustration, memory may be scrubbed by techniques including, but not limited to, writing back the corrected data to memory, a parity test, an electrical test, a striping test, a marching ones test, a marching zeroes test, and a "worst-case" pattern test. Thus, configuring the scrubber at 410 may include selecting a scrubbing technique.

The method 400 may also include, at 420, selectively copying the contents of a main memory location to a cache memory location in a main memory controller chipset. Once the contents have been copied, then the method 400 may include, at 430, logically replacing the main memory location with the cache memory location. Thus, memory access requests for the copied and mirrored main memory location may be directed to the cache memory location in the main memory controller chipset rather than to the main memory location in the main memory. With the main memory location copied and logically replaced, the method 400 may include, at 440, testing the main memory location. The testing may be performed, for example, by a testing logic in the main memory controller chipset. The testing may reveal a memory error in the main memory location.

Thus, the method 400 may include, at 450, determining whether a memory error has been encountered. If the determination at 450 is Yes, then at 460 the method 400 may selectively process the memory error by, for example, logging the error. The determination to log the error may be made in the main memory controller chipset. Similarly, the log in which the error is recorded may also be located in the main memory controller chipset. At 470, a determination is made concerning whether the set of main memory locations to be scrubbed has been covered. If so, then processing may conclude, otherwise processing may return to 420.

While FIG. 4 illustrates various actions occurring in serial, it is to be appreciated that various actions illustrated in FIG. 4 could occur substantially in parallel. By way of illustration, a first process could (re)configure a scrubber. Similarly, a second process could copy and/or mirror memory locations, while a third process could test memory locations. While three processes are described, it is to be appreciated that a greater and/or lesser number of processes could be employed and that lightweight processes, regular processes, threads, and other approaches could be employed. For example, one embodiment of method 400 includes only the methodology described in paragraph [0052].

FIG. 5 illustrates an example chipset based method 500 for scrubbing main memory and processing main memory faults encountered during scrubbing. The method 500 may include, at 510, configuring a scrubber (e.g., scrub logic) and at 520 configuring a fault manager. For example, parameters like how often memory is to be scrubbed, what memory is to be scrubbed, how is the memory to be scrubbed, what type of memory faults are to be handled and in what manner they are to be handled may be established.

The method 500 may also include, at 530, selecting a memory location to be scrubbed and for which memory fault management processing is to be performed. The memory location may be selected from a set of locations to be checked by manners including, but not limited to, randomly, linearly, according to a pre-established pattern, and so on.

At 540, the memory location may be processed. Processing a memory location can include, for example, selectively copying the contents of a main memory location to a cache memory location in a main memory controller chipset and logically replacing the main memory location with the cache memory location. Once the main memory location has been copied and logically replaced, the processing may also include testing the main memory location using, for example, a testing logic in the main memory controller chipset. The testing may reveal memory errors and/or generate memory faults.

Thus, the method 500 may include, at 550, determining whether a memory error or fault occurred. If the determination at 550 is Yes, then at 552, the method 500 may include evaluating the error. Based on the error type (e.g., single bit, multi-bit) the method 500 may selectively process the memory fault. The fault management processing may include, but is not limited to, selectively logging data associated with the memory fault, selectively attempting to correct the memory fault, selectively logically removing the main memory location from the main memory, and selectively halting the operation of a system whose memory is being scrubbed. Thus, at 554, the method 500 may include performing one or more of the fault management processes based, for example, on the type of memory fault encountered. The fault management processing may be performed, for example, in the main memory controller chipset.

In one example, a memory location may exhibit memory faults of a type that warrant logically removing the main memory location from the main memory. Thus, at 560, a determination is made concerning whether to logically remove a main memory location from the main memory. If the determination at 560 is Yes, then at 570 the main memory location is logically removed by, for example, reprogramming a memory controller to direct memory access requests from the logically removed location to a temporary location in a pool of available memory. If the determination at 560 is No, then at 580 the memory location may be unmirrored by, for example, copying the contents from the cache memory back to the main memory location and reversing the actions undertaken to redirect memory access requests to the cache memory location.

While FIG. 5 illustrates various actions occurring in serial, it is to be appreciated that various actions illustrated in FIG. 5 could occur substantially in parallel. By way of illustration, a first process could configure the scrubber and fault manager, a second process could select memory locations to scrub, a third process could process memory locations, a fourth process could evaluate errors and a fifth process could take the configurable actions. While five processes are described, it is to be appreciated that a greater and/or lesser number of processes could be employed and that lightweight processes, regular processes, threads, and other approaches could be employed.

Figure 5A:
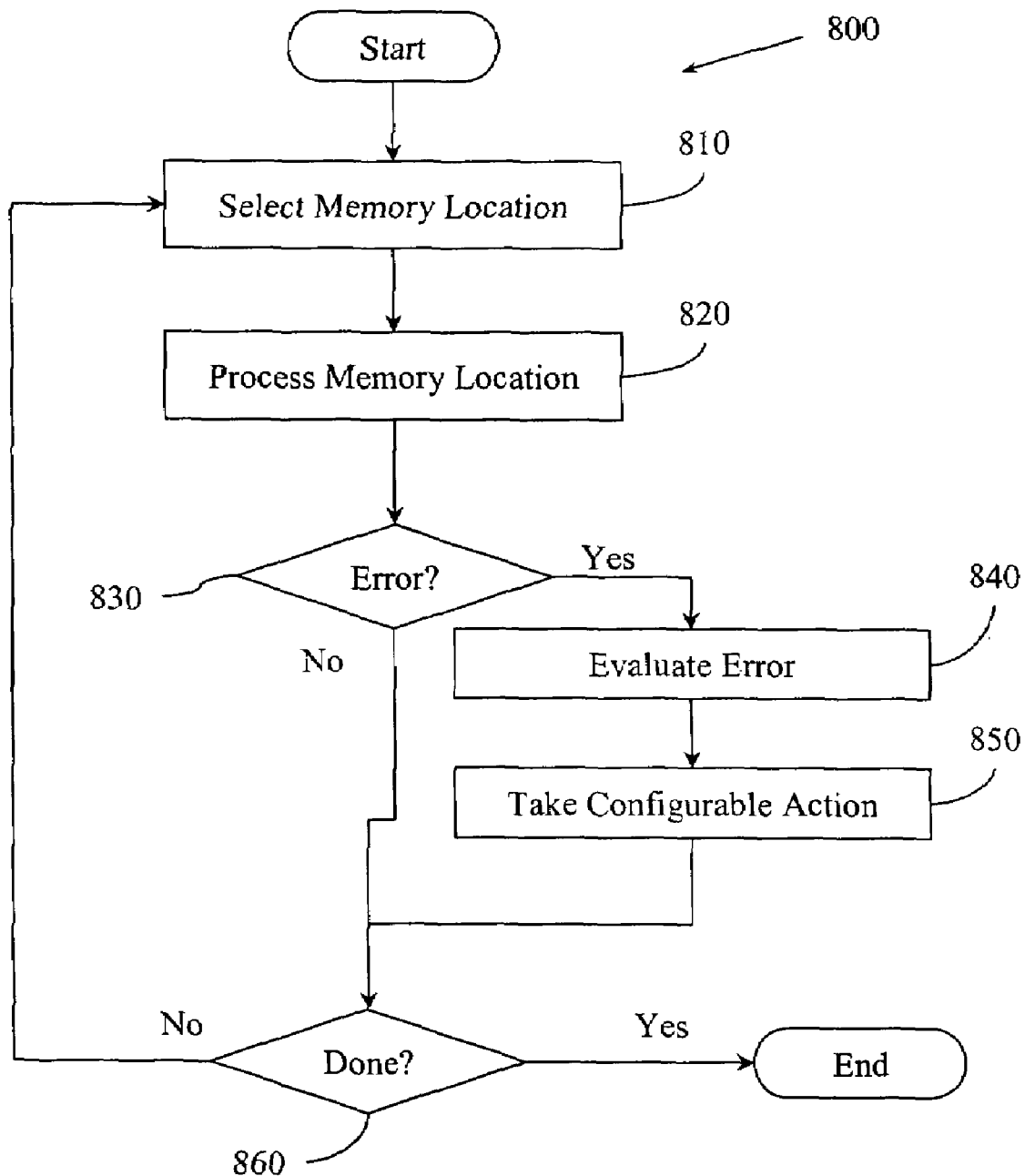
FIG. 5A illustrates an example chipset based method for scrubbing main memory.

For example, FIG. 5A illustrates a method 800 that includes, at 810, selecting a memory location to be scrubbed and for which memory fault management processing is to be performed. The memory location may be selected from a set of locations to be checked by manners including, but not limited to, randomly, linearly, according to a pre-established pattern, and so on.

At 820, the memory location may be processed. Processing a memory location can include, for example, selectively copying the contents of a main memory location to a cache memory location in a main memory controller chipset and logically replacing the main memory location with the cache memory location. Once the main memory location has been copied and logically replaced, the processing may also include testing the main memory location using, for example, a testing logic in the main memory controller chipset. The testing may reveal memory errors and/or generate memory faults.

Thus, the method 800 may include, at 830, determining whether a memory error or fault occurred. If the determination at 830 is Yes, then at 840, the method 800 may include evaluating the error. Based on the error type (e.g., single bit, multi-bit) the method 800 may selectively process the memory fault. The fault management processing may include, but is not limited to, selectively logging data associated with the memory fault, selectively attempting to correct the memory fault, selectively logically removing the main memory location from the main memory, and selectively halting the operation of a system whose memory is being scrubbed. Thus, at 850, the method 800 may include performing one or more of the fault management processes based, for example, on the type of memory fault encountered. The fault management processing may be performed, for example, in the main memory controller chipset.

At 860 a determination is made whether another location will be processed. If the determination is Yes, then processing returns to 810, otherwise processing can conclude.

In one example, a computer-readable medium may store processor executable instructions operable to perform a method that includes selectively copying the contents of a main memory location to a cache memory location in a main memory controller chipset, logically replacing the main memory location with the cache memory location, testing the main memory location, and selectively processing a memory fault associated with the main memory location when the memory testing of the main memory location yields a memory fault. In one example, the instructions on the computer-readable medium may be downloaded into a main memory controller chipset. While one method is described, it is to be appreciated that other computer-readable mediums could store other example methods described herein.

Figure 6:
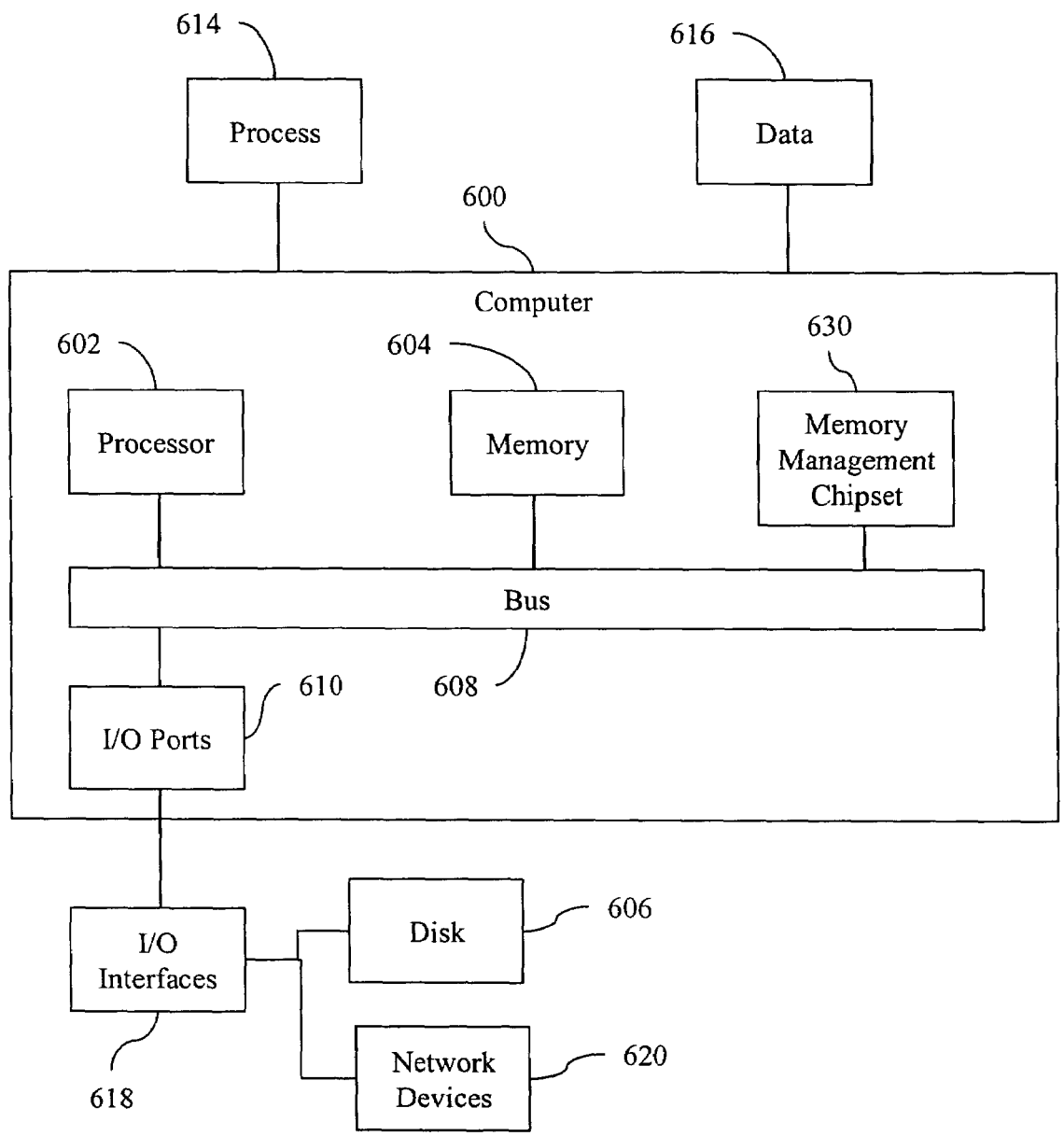
FIG. 6 illustrates an example computing environment in which example systems and methods illustrated herein can operate.

FIG. 6 illustrates a computer 600 that includes a processor 602, a memory 604, and input/output ports 610 operably connected by a bus 608. The computer 600 may also include a memory management chipset 630 similar to the example systems described herein. The memory management chipset 630 may include, for example, a logic that performs the example executable methods described herein. It is to be appreciated that other computers may also be employed with the systems and methods described herein. The memory management chipset 630 may be permanently and/or removably attached to computer 600.

The processor 602 can be a variety of various processors including dual microprocessor and other multi-processor architectures. The memory 604 can include volatile memory and/or non-volatile memory. The non-volatile memory can include, but is not limited to, read only memory (ROM), programmable read only memory (PROM), electrically programmable read only memory (EPROM), electrically erasable programmable read only memory (EEPROM), and the like. Volatile memory can include, for example, random access memory (RAM), synchronous RAM (SRAM), dynamic RAM (DRAM), synchronous DRAM (SDRAM), double data rate SDRAM (DDR SDRAM), and direct RAM bus RAM (DRRAM).

A disk 606 may be operably connected to the computer 600 via, for example, an input/output interface (e.g., card, device) 618 and an input/output port 610. The disk 606 can include, but is not limited to, devices like a magnetic disk drive, a solid state disk drive, a floppy disk drive, a tape drive, a Zip drive, a flash memory card, and/or a memory stick. Furthermore, the disk 606 can include optical drives like, a compact disc ROM (CD-ROM), a CD recordable drive (CD-R drive), a CD rewriteable drive (CD-RW drive) and/or a digital video ROM drive (DVD ROM). The memory 604 can store processes 614 and/or data 616, for example. The disk 606 and/or memory 604 can store an operating system that controls and allocates resources of the computer 600.

The bus 608 can be a single internal bus interconnect architecture and/or other bus or mesh architectures. The bus 608 can be of a variety of types including, but not limited to, a memory bus or memory controller, a peripheral bus or external bus, a crossbar switch, and/or a local bus. The local bus can be of varieties including, but not limited to, an industrial standard architecture (ISA) bus, a microchannel architecture (MSA) bus, an extended ISA (EISA) bus, a peripheral component interconnect (PCI) bus, a universal serial (USB) bus, and a small computer systems interface (SCSI) bus.

The computer 600 may interact with input/output devices via input/output ports 610 and i/o interfaces 618. Input/output devices can include, but are not limited to, a keyboard, a microphone, a pointing and selection device, cameras, video cards, displays, disk 606, network devices 620, and the like. The input/output ports 610 can include but are not limited to, serial ports, parallel ports, and USB ports.

The computer 600 can operate in a network environment and thus is connected to network devices 620 via the i/o ports 610 and i/o interfaces 618. Through the network devices 620, the computer 600 may interact with a network. Through the network, the computer 600 may be logically connected to remote computers. The networks with which the computer 600 may interact include, but are not limited to, a local area network (LAN), a wide area network (WAN), and other networks. The network devices 620 can connect to LAN technologies including, but not limited to, fiber distributed data interface (FDDI), copper distributed data interface (CDDI), Ethernet/IEEE 802.3, token ring/IEEE 802.5, wireless/IEEE 802.11, Bluetooth, and the like. Similarly, the network devices 620 can connect to WAN technologies including, but not limited to, point to point links, circuit switching networks like integrated services digital networks (ISDN), packet switching networks, and digital subscriber lines (DSL).

Figure 7:
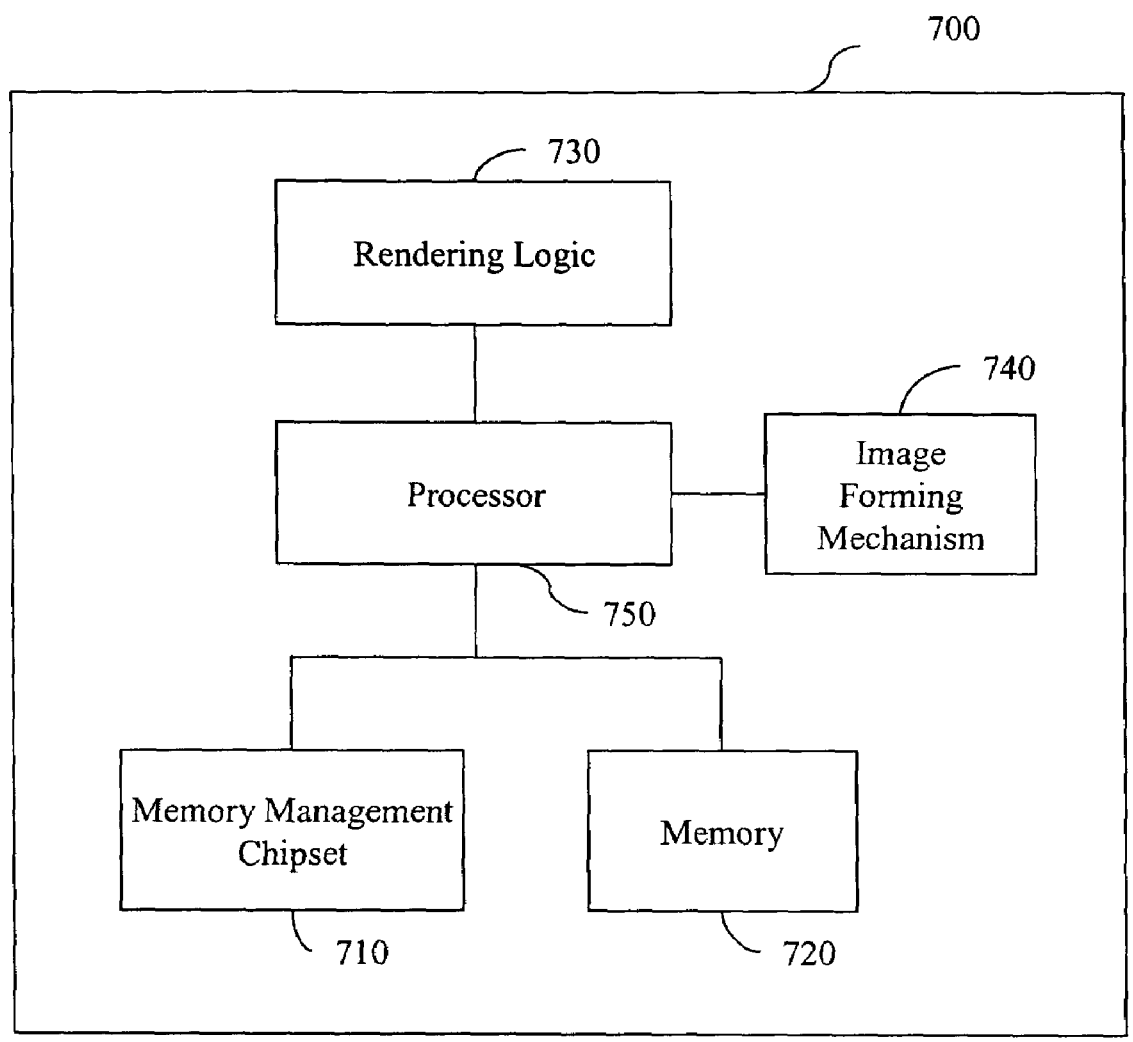
FIG. 7 illustrates an example image forming device in which example systems and methods illustrated herein can operate.

FIG. 7 illustrates an example image forming device 700 that includes a memory management chipset 710 similar to the example systems described herein. The memory management chipset 710 may include a logic that is configured to perform the executable methods like those described herein. The chipset 710 may be permanently and/or removably attached to the image forming device 700.

The image forming device 700 may receive print data to be rendered. Thus, image forming device 700 may also include a memory 720 configured to store print data or to be used more generally for image processing. The chipset 710 may, therefore, scrub and/or perform fault management processing for the memory 720. The image forming device 700 may also include a rendering logic 730 configured to generate a printer-ready image from print data. Rendering varies based on the format of the data involved and the type of imaging device. In general, the rendering logic 730 converts high-level data into a graphical image for display or printing (e.g., the print-ready image). For example, one form is ray-tracing that takes a mathematical model of a three-dimensional object or scene and converts it into a bitmap image. Another example is the process of converting HTML into an image for display/printing. It is to be appreciated that the image forming device 700 may receive printer-ready data that does not need to be rendered and thus the rendering logic 730 may not appear in some image forming devices.

The image forming device 700 may also include an image forming mechanism 740 configured to generate an image onto print media from the print-ready image. The image forming mechanism 740 may vary based on the type of the imaging device 700 and may include a laser imaging mechanism, other toner-based imaging mechanisms, an ink jet mechanism, digital imaging mechanism, or other imaging reproduction engine. A processor 750 may be included that is implemented with logic to control the operation of the image-forming device 700. In one example, the processor 750 includes logic that is capable of executing Java instructions. Other components of the image forming device 700 are not described herein but may include media handling and storage mechanisms, sensors, controllers, and other components involved in the imaging process.

While the systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on provided herein. Additional advantages and modifications will readily appear to those skilled in the art. Therefore, the invention, in its broader aspects, is not limited to the specific details, the representative apparatus, and illustrative examples shown and described. Accordingly, departures may be made from such details without departing from the spirit or scope of the applicants' general inventive concept. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the claims (e.g., A or B) it is intended to mean "A or B or both". When the applicants intend to indicate "only A or B but not both" then the term "only A or B but not both" will be employed. Similarly, when the applicants intend to indicate "one and only one" of A, B, or C, the applicants will employ the phrase "one and only one". Thus, use of the term "or" herein is the inclusive, and not the exclusive use. See, Bryan A. Garner, A Dictionary of Modern Legal Usage 624 (2d. Ed. 1995).

What is claimed is:

1. A system, comprising:
   a memory access logic configured to be operably connected to a main memory and a processor, the memory access logic comprising:
   a memory configured to store contents of a main memory location and to accept memory access requests for the main memory location from the processor while the contents of the main memory location are stored in the memory; and a scrub logic configured to selectively mirror the main memory location into the memory and to selectively scrub the main memory location.

2. The system of claim 1, where the memory access logic comprises an ASIC.

3. The system of claim 1, where the memory access logic comprises a PROM.

4. The system of claim 1, including a second memory configured to store one or more configuration parameters associated with scrubbing the main memory location, and where the scrub logic is further configured to selectively scrub the main memory location based, at least in part, on one or more of the configuration parameters.

5. The system of claim 4, where the second memory comprises one or more registers.

6. The system of claim 4, where the second memory is writeable by an application located external to the memory access logic.

7. The system of claim 4, where the second memory stores one or more of, an on/off parameter, an address of a main memory location to be scrubbed, a starting address of a range of main memory locations to be scrubbed, an ending address of the range of main memory locations to be scrubbed, a rate parameter associate& with the rate at which main memory scrubbing is to occur, and a log configuration parameter.

8. The system of claim 7, where the log configuration parameter stores one or more entry point addresses for one or more logging processes.

9. The system of claim 1, including a log configured to store a result value associated with scrubbing the main memory location, and where the scrub logic is further configured to selectively produce the result value.

10. The system of claim 9, where the log comprises one or more registers.

11. The system of claim 9, where the log is readable by an application located external to the memory access logic.

12. The system of claim 1, where the scrub logic is configured to selectively generate a signal when the main memory location that is being scrubbed exhibits a memory error.

13. The system of claim 1, where the scrub logic is configured to initiate scrubbing the main memory location by sending one or more signals to an onboard memory testing logic, where the onboard memory testing logic is physically connected to the main memory location.

14. The system of claim 1, where the scrub logic is writeable by an application located external to the memory access logic.

15. The system of claim 1, where the scrub logic is configured to scrub the main memory location transparently to operating system control of main memory.

16. The system of claim 1, where the system is embedded in a computer.

17. The system of claim 1, where the system is embedded in an image forming device.

18. The system of claim 1, including:
a fault management logic configured to selectively process a memory fault associated with the main memory location.

19. The system of claim 18, including a second memory, the second memory being configured to store one or more configuration parameters associated with the fault management processing of the main memory location, and where the fault management logic is further configured to selectively process the memory fault based, at least in part, on the configuration parameters.

20. The system of claim 19, where the second memory comprises one or more registers.

21. The system of claim 19, where the second memory is writeable by an application located external to the memory access logic.

22. The system of claim 19, where the second memory stores one or more of, an on/off parameter, an address of a main memory location for which fault management processing is to be performed, a starting address of a range of main memory locations for which fault management processing is to be performed, an ending address of the range of main memory locations for which fault management processing is to be performed, a rate parameter associated with the rate at which main memory fault management processing is to occur, and a log configuration parameter.

23. The system of claim 22, where the log configuration parameter stores one or more entry point addresses for one or more fault management processes.

24. The system of claim 18, including a log, the log being configured to store a result value associated with fault management processing of a memory fault experienced by the main memory location, and where the fault management logic is further configured to selectively produce the result value.

25. The system of claim 24, where the log comprises one or more registers.

26. The system of claim 24, where the log is readable by an application external to the memory access logic.

27. The system of claim 18, where the fault management logic is configured to selectively generate a signal when the main memory location exhibits a memory fault.

28. The system of claim 18, where the fault management logic is writeable by an application external to the memory access logic.

29. The system of claim 18, where the fault management logic is configured to perform fault management processing for the main memory location transparently to operating system control of main memory.

30. The system of claim 29, where the fault management logic is further configured to perform one or more of, selectively logging data associated with the memory fault, selectively attempting to correct the memory fault, selectively logically removing the main memory location from the main memory, and selectively halting the operation of a computer with which the system is associated.

31. The system of claim 18, where the system is embedded in one or more of a computer and an image fonning device.

32. A system, comprising:
a main memory controller configured to be operably connected to a main memory and a processor, the main memory controller comprising:
a memory configured to logically replace one or more main memory locations;
a scrub logic configured to selectively scrub the one or more main memory locations; and
a fault management logic configured to selectively process a memory fault generated by the one or more main memory locations.

33. The system of claim 32, where the main memory controller comprises an ASIC.

34. The system of claim 32, where the main memory controller comprises a PROM.

35. The system of claim 32, including a second memory configured to store one or more configuration parameters associated with scrubbing the one or more main memory locations or processing a memory fault generated by the one or more main memory locations, where the scrub logic is further configured to selectively scrub the main memory locations based, at least in part, on one or more of the configuration parameters, and where the fault management logic is further configured to selectively process a memory fault generated by the main memory locations based, at least in part, on one or more of the configuration parameters.

36. The system of claim 32, where the second memory comprises one or more registers.

37. The system of claim 32, where the second memory is writeable by an application.

38. The system of claim 35, where the second memory stores one or more of, one or more on/off parameters, an address of a main memory location to be scrubbed, a starting address of a range of main memory locations to be scrubbed, an ending address of the range of main memory locations to be scrubbed, a rate parameter associated with the rate at which main memory scrubbing is to occur, an address of a main memory location for which fault management processing is to be pertimed, a start address of a range of main memory locations for which fault management processing is to be perfromed, an ending address of the range of main memory locations for which fault management processing is to be performed, and a log configuration parameter.

39. The system of claim 38, where the log configuration parameter stores one or more entry point addresses for one or more fault management processes.

40. The system of claim 32, including a log configured to store a result value associated with scrubbing the main memory locations or processing a memory fault generated by the main memory locations and where the fault management logic is further configured to selectively produce the result value.

41. The system of claim 40, where the log comprises one or more registers.

42. The system of claim 40, where the log is readable by an application.

43. The system of claim 32, where the scrub logic is further configured to initiate scrubbing the main memory locations by sending one or more signals to an onboard memory testing logic, where the onboard memory testing logic is physically connected to the main memory locations.

44. The system of claim 32, where the scrub logic is writeable by an application.

45. The system of claim 32, where the fault management logic is writeable by an application.

46. The system of claim 32, where the scrub logic is further configured to scrub the main memory locations transparently to operating system control of main memory.

47. The system of claim 32, where the fault management logic is further configured to process memory faults generated by the main memory locations transparently to operating system control of main memory.

48. The system of claim 32, where the system is embedded in a computer.

49. The system of claim 32, where the system is embedded in an image forming device.

50. A method, comprising:
selectively copying contents of a main memory location to a cache memory location in a main memory controller chipset;
logically replacing the main memory location with the cache memory location; and
memory testing the main memory location, where the memory testing is performed by a testing logic in the main memory controller chipset.

51. The method of claim 50, comprising:
selectively processing a memory fault associated with the main memory location when the memory testing of the main memory location produces a memory fault, where the memory fault processing is performed in the main memory controller chipset.

52. The method of claim 51, where the fault management processing includes one or more of, selectively logging data associated with the memory fault, selectively attempting to correct the memory fault, selectively logically removing the main memory location from the main memory, and selectively halting the operation of a system to which the main memory controller chipset is operably connected.

53. The method of claim 50, where the main memory location can be scrubbed or tested by one or more of, writing back corrected data to the memory location, a parity test, an electrical test, a striping test, a marching ones test, a marching zeroes test, and a pattern test.

54. A computer-readable medium storing processor executable instructions operable to perform a method, the method comprising:
selectively copying contents of a main memory location to a cache memory location in a main memory controller chipset;
logically replacing the main memory location with the cache memory location;
memory testing the main memory location, where the memory testing is performed by a testing logic in the main memory controller chipset; and
selectively processing a memory fault associated with the main memory location when the memory testing of the main memory location produces a memory fault, where the fault management processing is performed in the main memory controller chipset.

55. A memory access system, comprising:
a memory access logic configured to be operably connected to a main memory and a processor, the memory access logic including:
a memory;
a logic configured to:
select a memory location from the main memory and copy contents of the memory location to the memory;
cause memory access requests directed to to memory location to be redirected to the memory; and
perform memory management operations for the memory location while the contents of the memory location are accessible through the memory without disturbing the operation of components configured to access the memory location.

56. The memory access system of claim 55, where the memory management operations include memory scrubbing.

57. The memory access system of claim 55, where the memory management operations include fault processing.

58. A system, comprising:
means for logically replacing a main memory location with a cache memory location in a main memory controller chipset, where the means for logically replacing are located in the main memory controller chipset;

means for testing the main memory location, where the means for testing the main memory location are located in the main memory controller chipset; and means for managing memory faults associated with the main memory location, where the means for managing memory faults are located in the main memory controller chipset.

* * * * *

UNITED STATES PATENT AND TRADEMARK OFFICE
CERTIFICATE OF CORRECTION

PATENT NO. : 7,328,380 B2
APPLICATION NO. : 10/659901
DATED : February 5, 2008
INVENTOR(S) : Ken Gary Pomaranski et al.

It is certified that error appears in the above-identified patent and that said Letters Patent is hereby corrected as shown below:

In column 15, line 26, in Claim 7, delete "associate&" and insert -- associated --, therefor.

In column 16, line 51, in Claim 31, delete "fonning" and insert -- forming --, therefor.

In column 17, line 12, in Claim 36, delete "32" and insert -- 35 --, therefor.

In column 17, line 14, in Claim 37, delete "32" and insert -- 35 --, therefor.

In column 17, line 24, in Claim 38, delete "pertimed" and insert -- performed --, therefor.

In column 17, line 26, in Claim 38, delete "perfromed" and insert -- performed --, therefor.

In column 18, line 49, in Claim 55, after "directed to" delete "to" and insert -- the --, therefor.

Signed and Sealed this

Tenth Day of June, 2008

JON W. DUDAS
*Director of the United States Patent and Trademark Office*